(12) United States Patent
Cho et al.

(10) Patent No.: US 10,312,049 B2
(45) Date of Patent: Jun. 4, 2019

(54) SAMPLE CHAMBER DEVICE FOR ELECTRON MICROSCOPE, AND ELECTRON MICROSCOPE COMPRISING SAME

(71) Applicant: KOREA RESEARCH INSTITUTE OF STANDARDS AND SCIENCE, Daejeon (KR)

(72) Inventors: Bok Lae Cho, Daejeon (KR); Sang Jung Ahn, Daejeon (KR); Inho Sul, Daejeon (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 0 days.

(21) Appl. No.: 15/576,686

(22) PCT Filed: Aug. 11, 2016

(86) PCT No.: PCT/KR2016/008817
§ 371 (c)(1),
(2) Date: Nov. 22, 2017

(87) PCT Pub. No.: WO2017/034190
PCT Pub. Date: Mar. 2, 2017

(65) Prior Publication Data
US 2018/0158645 A1    Jun. 7, 2018

(30) Foreign Application Priority Data
Aug. 21, 2015  (KR) .................. 10-2015-0117737

(51) Int. Cl.
*H01J 37/16* (2006.01)
*H01J 37/20* (2006.01)
(Continued)

(52) U.S. Cl.
CPC .......... *H01J 37/16* (2013.01); *G02B 21/0004* (2013.01); *G02B 21/02* (2013.01);
(Continued)

(58) Field of Classification Search
CPC .. H01J 37/16; H01J 37/18; H01J 37/20; H01J 37/226; H01J 37/244; H01J 37/26;
(Continued)

(56) References Cited

U.S. PATENT DOCUMENTS 3,727,026 A * 4/1973 Baumgartner ......... B23K 15/06
219/121.13
8,530,856 B2 * 9/2013 Spruck ............... G02B 21/0004
250/310
(Continued)

FOREIGN PATENT DOCUMENTS

JP      2004-31537 A    1/2004
JP      2010-257995 A   11/2010
(Continued)

OTHER PUBLICATIONS

International Search Report dated Nov. 4, 2016 of PCT/KR2016/008817 which is the parent application and its English translation—6 pages.

*Primary Examiner* — David E Smith
(74) *Attorney, Agent, or Firm* — Knobbe Martens Olson & Bear LLP

(57) ABSTRACT

A vacuum sample chamber for a particle and optical device includes on one surface thereof, an aperture through which a particle beam to be focused along an optical axis of particles such as electrons, ions and neutral particles is incident; and on the opposite surface thereof, a detachable sample holder through which light penetrates, thereby enabling a sample to be observed and analyzed by means of the particle beam and light. A sample chamber is capable of (Continued)

reducing observation time by maintaining a vacuum therein even when a sample is put into or taken out from a sample chamber of an electron microscope or focused ion beam observation equipment, and capable of obtaining an optical image on the outside thereof without inserting a light source or an optical barrel into the sample chamber. A light-electron fusion microscope comprising the sample chamber.

14 Claims, 14 Drawing Sheets

(51) Int. Cl.
  *H01J 37/26* (2006.01)
  *G02B 21/00* (2006.01)
  *G02B 21/02* (2006.01)
  *G02B 21/06* (2006.01)
  *G02B 21/36* (2006.01)
  *H01J 37/18* (2006.01)
  *H01J 37/22* (2006.01)
  *H01J 37/244* (2006.01)
  *H01J 37/285* (2006.01)

(52) U.S. Cl.
  CPC .............. *G02B 21/06* (2013.01); *G02B 21/36* (2013.01); *G02B 21/361* (2013.01); *H01J 37/18* (2013.01); *H01J 37/20* (2013.01); *H01J 37/226* (2013.01); *H01J 37/244* (2013.01); *H01J 37/26* (2013.01); *H01J 37/285* (2013.01); *H01J 2237/166* (2013.01); *H01J 2237/182* (2013.01); *H01J 2237/2448* (2013.01); *H01J 2237/2808* (2013.01); *H01J 2237/2855* (2013.01)

(58) Field of Classification Search
  CPC ............... H01J 37/285; H01J 2237/166; H01J 2237/182; H01J 2237/2448; H01J 2237/2808; H01J 2237/2855; G02B 21/02; G02B 21/06; G02B 21/36; G02B 21/361
  See application file for complete search history.

(56) References Cited

U.S. PATENT DOCUMENTS

| | | | | |
|---|---|---|---|---|
| 2006/0098188 | A1* | 5/2006 | Buijsse | G01N 21/6428 356/72 |
| 2008/0099674 | A1* | 5/2008 | Bihr | G03F 1/72 250/307 |
| 2010/0171037 | A1* | 7/2010 | Bierhoff | H01J 37/16 250/310 |
| 2015/0228449 | A1* | 8/2015 | Kawanishi | H01J 37/16 250/307 |

FOREIGN PATENT DOCUMENTS

| | | |
|---|---|---|
| JP | 2011-228170 A | 11/2011 |
| KR | 10-2005-0060995 A | 6/2005 |
| KR | 10-2015-0046265 A | 4/2015 |

* cited by examiner

SAMPLE CHAMBER DEVICE FOR ELECTRON MICROSCOPE, AND ELECTRON MICROSCOPE COMPRISING SAME

TECHNICAL FIELD

The present invention relates to a sample chamber device for an electron microscope, and more particularly, to a sample chamber device for an electron microscope, which includes a sample holder detachably installed on one surface of a sample chamber, the sample holder capable of transmitting light while maintaining a vacuum state, an electron microscope including the same, and a photoelectron microscope.

BACKGROUND ART

A scanning electron microscope (SEM) scans a sample located in a vacuum sample chamber with a focused electron beam, and detects secondary electrons or back-scattered electrons among signals generated from the sample, thereby making it possible for a researcher to observe the target sample.

Since an electron is very light, the electron bounces off a gas molecule when colliding with the gas molecule. Thus, when air is present in a body tube, the electron cannot actively move. Therefore, a high vacuum state of approximately $10^{-4}$ to $10^{-10}$ Torr is maintained in a body tube of an electron microscope or focused ion beam observation equipment.

The vacuum degree of a sample chamber on which an electron beam emitted from the body tube is incident must be maintained at approximately $10^{-3}$ Torr. This is because when the sample chamber is maintained in a low vacuum state, gas may flow backward to the body tube maintained in a high vacuum state. Furthermore, when a sample is put into or taken out of the sample chamber, the vacuum of the sample chamber changes to the atmospheric pressure. Therefore, a predetermined waiting time must be taken until the sample chamber reaches a vacuum degree required for observation of the electron microscope. In order to reduce such a waiting time, an auxiliary sample chamber for maintaining the vacuum degree of the sample chamber is suggested.

In a photoelectron microscope for observing a specific portion of an image observed through an optical microscope in more detail, a light source or light detector must be inserted into a sample chamber. Therefore, a structure for maintaining a vacuum state in the sample chamber becomes more complex than a sample chamber of a general electron microscope.

U.S. Pat. No. 8,530,856 discloses an optical microscope including a sample chamber having a valve installed at a portion connected to a body tube. In the related art, however, when a sample is put into or taken out of the sample chamber, the sample chamber cannot maintain a vacuum state. Furthermore, the size of the sample chamber is increased in order to insert a light source or optical body tube into the sample chamber. Thus, a time and cost are required until the sample chamber reaches a vacuum degree.

DISCLOSURE

Technical Problem

The present invention is intended to provide a technology capable of a sample chamber device which is capable of shortening an observation time by maintaining a sample chamber in a vacuum state even when a sample is put into or taken out of the sample chamber of an electron microscope, and acquiring an optical image from outside without inserting a light source or body tube into the sample chamber.

Technical Solution

In order to solve the technical problem, the present inventors have constructed a vacuum sample chamber which has an aperture formed at the top surface thereof and a detachable sample holder formed at the bottom surface, and fixes a sealing member between the bottom surface and the sample holder such that a vacuum is maintained when the sample holder is detached or attached.

In one aspect, the present invention provides a sample chamber device for an electron microscope, including: a vacuum chamber having an aperture formed in a top surface portion thereof such that an electron beam emitted from an body tube is incident through the aperture, and including a vacuum holding plate sealing a hole of a bottom surface portion from outside, the hole facing the aperture; an electron detector located in the vacuum chamber; and a sample holder being horizontally movable to the position of the vacuum holding plate while the vacuum chamber is maintained in a vacuum state, and having a sample groove formed therein. The sample groove may be horizontally moved and exposed to the vacuum chamber, and the vacuum chamber and the sample holder may be formed of a material capable of shielding radioactive rays including X-rays.

In one embodiment, the vacuum chamber may include: the top surface portion having the aperture formed in the center thereof such that the electron beam passes through the aperture; the bottom surface portion facing the top surface portion, and having the hole formed at a position facing the aperture of the top surface portion such that the electron beam passes through the hole; a side surface portion airtightly connecting the corners of the top surface portion and the bottom surface portion so as to form a first space therein, and having a vacuum exhaust part formed therein; a ring-shaped sealing member being in airtight contact with an outer surface of the bottom surface portion at the first space, and surrounding the hole; the vacuum holding plate being in contact with the ring-shaped sealing member to form a sealed second space with the ring-shaped sealing member and the bottom surface portion surrounded by the ring-shaped sealing member, and movable in the horizontal direction; a track part fixing the sample holder such that the sample holder brought in contact with the vacuum holding plate with a linear sealing member interposed therebetween is horizontally moved while coming in contact with the ring-shaped sealing member, in order to push out the vacuum holding plate while maintaining airtightness of the second space; and an elastic member applying a restoring force to the vacuum holding plate to face the formation position of the second space, such that the vacuum holding plate maintains airtightness with the sample holder, with the linear sealing member interposed therebetween. The electron detector may be positioned on the inner surface of the top surface portion at the first space.

In another embodiment, the sample holder may be formed in a plate shape which is brought in airtight contact with the vacuum holding plate, and the sample groove may be placed in the second space when the vacuum holding plate is pushed out to form the second space, and secure a level difference to protect a sample when the sample holder is horizontally moved while coming in contact with the ring-shaped sealing member.

In still another embodiment, the electron detector may include a secondary electron detector.

In yet another embodiment, the track part may have a fastening part for fixing the vacuum holding plate and the sample holder when the vacuum holding plate and the sample holder are placed at a predetermined position of the second space.

In still yet another embodiment, the vacuum chamber may have a vacuum exhaust part connected to a vacuum exhaust part of the body tube.

In a further embodiment, the sample holder may transmit rays including visible rays, infrared rays and ultraviolet rays.

In another aspect, the present invention provides a sample chamber device for an electron microscope, including: a first vacuum chamber having an aperture formed in a top surface portion thereof such that an electron beam emitted from a body tube is incident through the aperture, and including a vacuum holding plate sealing a hole of a bottom surface portion from outside, the hole facing the aperture; a third vacuum chamber located in parallel to the bottom surface portion of the first vacuum chamber while being in contact with the first vacuum chamber, and sealing a bottom surface portion with the vacuum holding plate, the bottom surface portion having a hole formed therein; an external connection portion for the first and third vacuum chambers; an electron detector located in the first vacuum chamber; and a sample holder being horizontally movable to the position of the vacuum holding plate while the first and third vacuum chambers are maintained in a vacuum state, and having a sample groove formed therein. The sample groove may be horizontally moved and exposed to the first or third vacuum chamber, and the vacuum chamber and the sample holder may be formed of a material capable of shielding radioactive rays including X-rays.

In one embodiment, the first vacuum chamber may include: the top surface portion having the aperture formed in the center thereof such that the electron beam passes through the aperture; the bottom surface portion facing the top surface portion, and having the hole formed at a position facing the aperture of the top surface portion such that the beam passes through the hole; a side surface portion airtightly connecting the corners of the top surface portion and the bottom surface portion so as to form a first space therein, and having a vacuum exhaust part formed therein; a first ring-shaped sealing member being in airtight contact with an outer surface of the bottom surface portion at the first space, and surrounding the hole; and the vacuum holding plate being in contact with the first ring-shaped sealing member to form a sealed second space with the first ring-shaped sealing member and the bottom surface portion surrounded by the first ring-shaped sealing member, and moveable in the horizontal direction. The third vacuum chamber may include: a space portion forming a third space therein, and having a vacuum exhaust part formed therein; a bottom surface portion having a hole formed at a predetermined distance from the hole of the bottom surface of the first vacuum chamber; a second ring-shaped sealing member surrounding the hole of the bottom surface of the third vacuum chamber and the first ring-shaped sealing member surrounding the hole of the bottom surface portion of the first vacuum chamber; and a vacuum holding plate being in contact with the first and second ring-shaped sealing members at the same time so as to form the second and third spaces, and moveable in the horizontal direction. The external connection portion for the first and third vacuum chambers may include: a track part fixing the sample holder such that the sample holder brought in contact with the vacuum holding plate with a linear sealing member interposed therebetween is horizontally moved while coming in contact with the first and second ring-shaped sealing members, in order to push out the vacuum holding plate while maintaining the airtightness of the second space, after the sample groove of the sample holder is placed in the third space to perform vacuum exhaust; and an elastic member applying a restoring force to the vacuum holding plate to face the formation positions of the second and third spaces, such that the vacuum holding plate maintains airtightness with the sample holder with the linear sealing member interposed therebetween. The electron detector may be located on the inner surface of the top surface portion at the first space in the first vacuum chamber.

In another aspect, the sample holder may be formed in a plate shape which is brought in airtight contact with the vacuum holding plate, and the sample groove may be placed in the second space when the vacuum holding plate is pushed out to form the second space, and secure a level difference to protect a sample when the sample holder is horizontally moved while coming in contact with the first and second ring-shaped sealing members.

In still another embodiment, the sample holder may transmit rays including visible rays, infrared rays and ultraviolet rays.

In still another aspect, the present invention provides an electron microscope including the sample chamber device.

In yet another aspect, the present invention provides a photoelectron microscope including: an electron microscope having the sample chamber device; and an optical microscope unit. The optical microscope unit may include: an optical object lens placed to face the sample groove from the outside of the second space of the sample holder; an optical path branching device installed on an extension line of an optical path connected from the sample groove to the optical object lens, and branching the optical path; a light source configured to provide incident light to the optical path branching device; a cathode luminescence detector configured to detect cathode luminescence at a position of the optical path past the optical path branching device; and an optical image detector configured to detect an optical image at a position of the optical path past the optical path branching device. The cathode luminescence may be emitted from an electron beam incident on a sample located in the sample groove, and the optical image may include an image which is generated when incident light provided from the light source goes back along the optical path through the optical path branching device, passes through the sample holder, and reflects from the sample placed in the sample groove.

In an embodiment, the cathode luminescence detector and the optical image detector may acquire the cathode luminescence and the optical image by temporally or spatially splitting light through a beam splitter.

Advantageous Effects

According to the embodiments of the present invention, the sample chamber device can maintain the sample chamber in a vacuum state while horizontally moving the sample holder, when a sample is replaced. Thus, the sample chamber device can improve the efficiency of sample analysis. Furthermore, the sample holder located at the hole of the bottom surface portion of the sample chamber may be formed of a transparent material, such that cathode luminescence and an optical image can be acquired without installing a separate light source, light guide part or light detector in the sample chamber or an electron beam optical system.

MODE FOR INVENTION

Hereinafter, preferred embodiments of the present invention will be described in detail with reference to the accompanying drawings such that the present invention can easily be embodied by a person with ordinary skill in the art to which the invention pertains. Before the present invention is described in detail, the terms or words used in this specification and claims should not be limited to typical definitions or dictionary definitions. Therefore, the configurations described in this specification and the drawings are only preferred embodiments of the present invention, and do not fully represent the technical idea of the present invention. Thus, various equivalents and modifications capable of replacing the embodiments may be provided at the point of time that the present application is filed.

In one aspect, the present invention provides a sample chamber device including: a vacuum chamber having an aperture formed in a top surface portion thereof such that an electron beam emitted from a body tube is incident through the aperture, and including a vacuum holding plate sealing a hole of a bottom surface portion from outside, the hole facing the aperture; an electron detector located in the vacuum chamber; and a sample holder being horizontally movable to the position of the vacuum holding plate while the vacuum chamber is maintained in a vacuum state, and having a sample groove formed therein. The sample groove is horizontally moved and exposed to the vacuum chamber, and the vacuum chamber and the sample holder are formed of a material capable of shielding radioactive rays including X-rays.

Figure 1A:
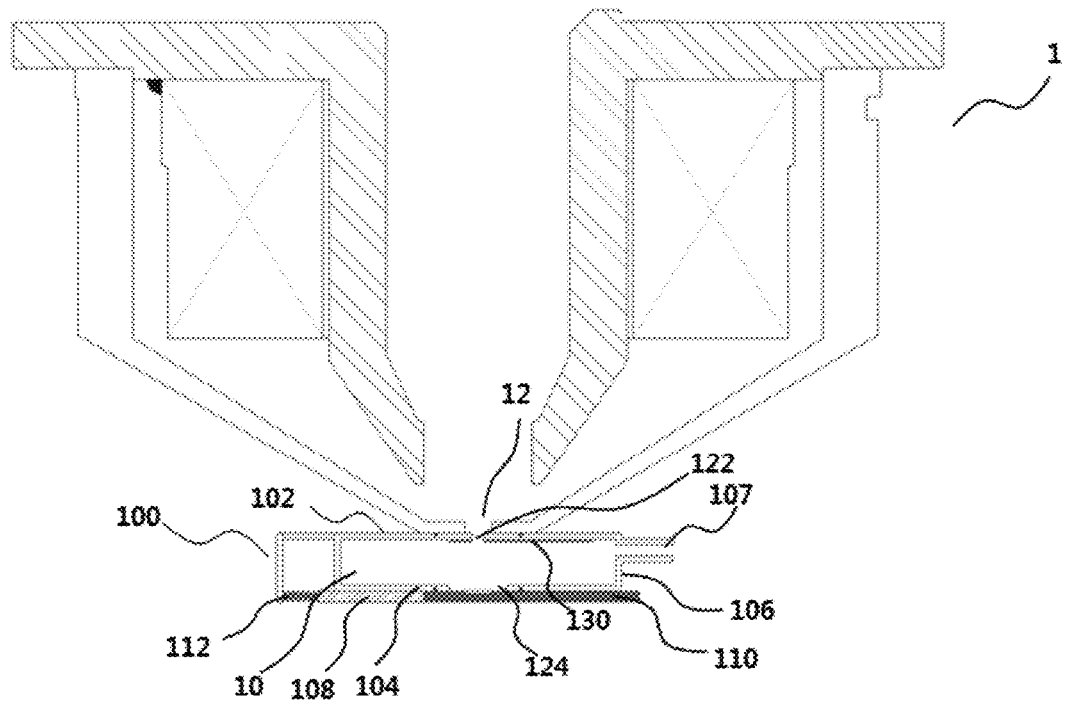
FIG. 1A is a cross-sectional view illustrating that a vacuum sample chamber according to an embodiment of the present invention is in contact with a body tube of an electron microscope.
Figure 1B:
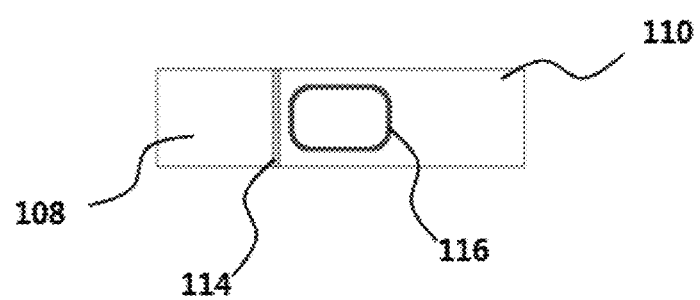
FIG. 1B is a plan view of a vacuum holding plate and a sample holder with a linear sealing member interposed therebetween.
Figure 1C:
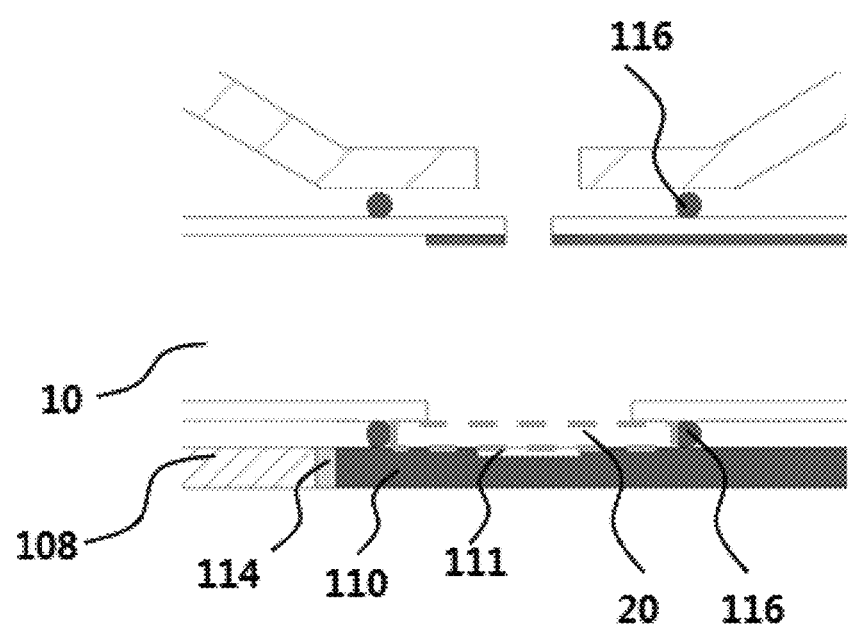
FIG. 1C is a detailed cross-sectional view of the sample chamber.

FIG. 1A is a cross-sectional view of an electron microscope including a sample chamber for an electron microscope according to an embodiment of the present invention, FIG. 1B is a plan view of a vacuum holding plate 108 and a sample holder 110 with a linear sealing member 114 interposed therebetween, and FIG. 1C illustrates that the sample holder 110 is placed at a sample observation position. A vacuum sample chamber 100 of the sample chamber device includes a top surface portion 102, a bottom surface portion 104, a side surface portion 106, a first ring-shaped sealing member 116, a vacuum holding plate 108, a track part and an elastic member 112. The top surface portion 102 has an aperture 122 formed in the center thereof such that an electron beam passes through the aperture 122. The bottom surface portion 104 faces the top surface portion and has a hole 124 formed at a position facing the aperture of the top surface such that the electron beam can pass through the hole. The side surface portion 106 forms a first space 10 by airtightly connecting the corners of the top surface portion 102 and the bottom surface portion 104, and has a first vacuum exhaust part 107 formed therein. The first ring-shaped sealing member 116 is in airtight contact with an outer surface of the bottom surface portion 104 at the first space 10, and surrounds the hole. The vacuum holding plate 108 is in contact with the first ring-shaped sealing member so as to form a sealed second space 20 with the first ring-shaped sealing member 116 and the bottom surface portion 104 surrounded by the first ring-shaped sealing member 116, and can be horizontally moved. The track part fixes the sample holder 110 such that the sample holder 110 brought in contact with the vacuum holding plate 108 with the linear sealing member 114 interposed therebetween can be horizontally moved while coming in contact with the first ring-shaped sealing member 116, in order to push out the vacuum holding plate 118 while maintaining the airtightness of the second space 20. The elastic member 112 applies a restoring force to the vacuum holding plate to face the formation position of the second space, such that the vacuum holding plate can maintain airtightness with the sample holder 110, with the linear sealing member 114 interposed therebetween. The electron detector 130 is located on the inner surface of the top surface portion at the first space. In an embodiment of the present invention, the vacuum sample chamber 100 is airtightly bonded to an electron beam emission part 12 of the body tube maintained in a vacuum state. In an embodiment of the present invention, the first vacuum exhaust part may be connected to a separate vacuum exhaust line, or connected to a vacuum exhaust line of the body tube.

In an embodiment of the present invention, the vacuum degree of the first space 10 ranges from $10^{-1}$ Torr to $10^{-6}$ Torr. The aperture 122 is formed in a circular shape having a size through which a particle beam of the body tube can be incident. Specifically, a high vacuum part of the body tube and a low vacuum part of the vacuum sample chamber are connected through the aperture, but the size of the aperture has no influence on the vacuum degree of the body tube. In an embodiment of the present invention, the aperture has a diameter of approximately 0.1 to 2 mm.

The electron detector 130 is placed on the inner surface of the top surface portion at the first space 10. In an embodiment of the present invention, the electron detector may include a secondary electron detection scintillator or back scattering electron detector. In an embodiment of the present invention, since the electron detector is located at a position close to the sample, the detection sensitivity can be improved.

The first ring-shaped sealing member 116 is installed on the outer surface of the bottom surface portion at the first space 10, and surrounds the hole while maintaining airtightness at the contact position with the outer surface. In an embodiment of the present invention, the sealing member is an O-ring or gasket. As illustrated in FIG. 1C, the first ring-shaped sealing member 116 implemented with an O-ring or gasket forms the second space 20 with the bottom surface portion while being in contact with the vacuum holding plate 108 and/or the sample holder 110. The second space 20 is connected to the first space 10 through the hole. In an embodiment of the present invention, the vacuum holding plate 108 is brought in contact with the first ring-shaped sealing member 116 so as to form the sealed second space 20 with the first ring-shaped sealing member 116 and the bottom surface portion 104 surrounded by the first ring-shaped sealing member 116, and can be moved in the horizontal direction. The vacuum holding plate 108 can be horizontally moved along the track part (not illustrated), and the track part can be horizontally moved in one direction, but is not limited thereto. For example, the track part can be moved along two axes crossing each other on a parallel plane. In an embodiment of the present invention, the track part may have a fastening part (not illustrated) for fixing the vacuum holding plate 108 and the sample holder 110 when the vacuum holding plate 108 and the sample holder 110 are placed at a predetermined position of the second space.

In an embodiment of the present invention, the sample holder 110 is formed in a plate shape which can be brought in airtight contact with the vacuum holding plate. At this time, the sample holder 110 may be brought in contact with the vacuum holding plate with the linear sealing member 114 interposed therebetween. When the vacuum holding plate is pushed out to form the second space 20, a sample groove 111 is placed in the second space. The sample groove 111 secures a level difference for protecting the sample, when the sample holder 110 is horizontally moved while coming in contact with the first ring-shaped sealing member 116. The linear sealing member 114 may be formed of the same material as the first ring-shaped sealing member 116.

When the sample holder 110 is horizontally moved while coming in contact with the first ring-shaped sealing member 116, the elastic member 112 applies a restoring force to the vacuum holding plate to face the formation position of the second space 20. Thus, the vacuum holding plate can maintain airtightness with the sample holder 110, with the linear sealing member 114 interposed therebetween. The elastic member 112 provides a force to the vacuum holding plate 108 such that the sample holder 110 and the vacuum holding plate 108 are brought in contact with each other with the linear sealing member 114 interposed therebetween, when the sample holder 110 and the vacuum holding plate 108 are horizontally moved. In an embodiment of the present invention, the elastic member 112 is a spring.

In an embodiment of the present invention, the sample groove 111 is formed in a shape capable of protecting a sample when the sample holder 110 is horizontally moved while coming in contact with the first ring-shaped sealing member 116, and the sample located in the sample groove 111 is placed under a surface of the sample holder, facing the second space. When a charged electron beam reaches the sample in the vacuum sample chamber 100, the electron beam may emit X-rays. Even when electrons of the sample are excited by an incident beam and then transition to the ground state, characteristic X-rays may be emitted. Therefore, the top surface portion 102, the bottom surface portion 104, the side surface portion 106, the first ring-shaped sealing member 116, the vacuum holding plate 108, the linear sealing member 114 and the sample holder 110 may be formed of a material capable of shielding radioactive rays including X-rays. In an embodiment of the present invention, the top surface portion 102, the bottom surface portion 104, the side surface portion 106 and the vacuum holding plate 108 may be formed of a metal, the sample holder 110 may be formed of lead glass, and the first ring-shaped sealing member 116 may include an O-ring or metal gasket having a shielding function.

Figure 2A:
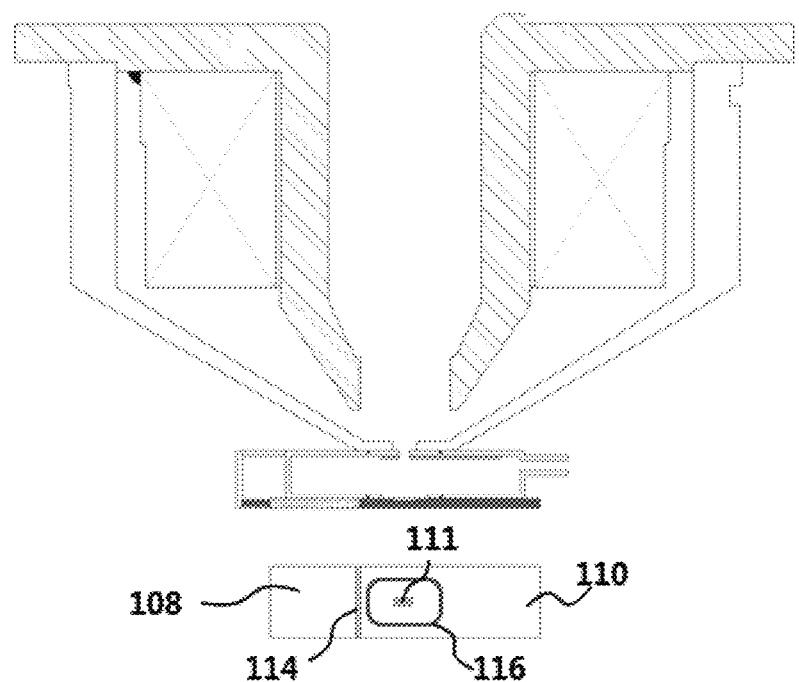
FIG. 2A is a conceptual view illustrating that a sample is placed at a sample observation position according to the embodiment of the present invention.
Figure 2B:
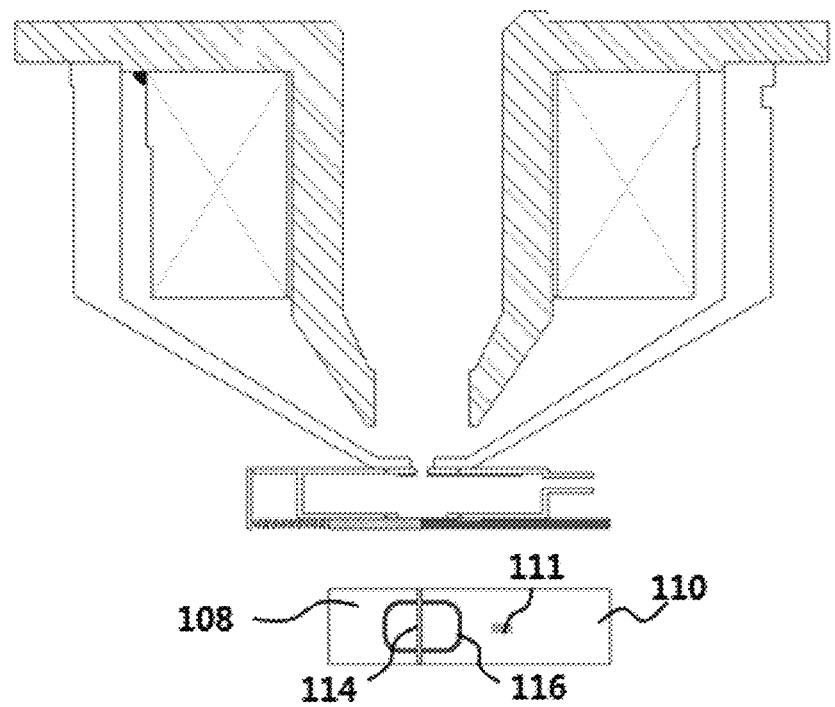
FIG. 2B is a conceptual view illustrating that the sample holder is horizontally moved to remove the sample from a second space.
Figure 2C:
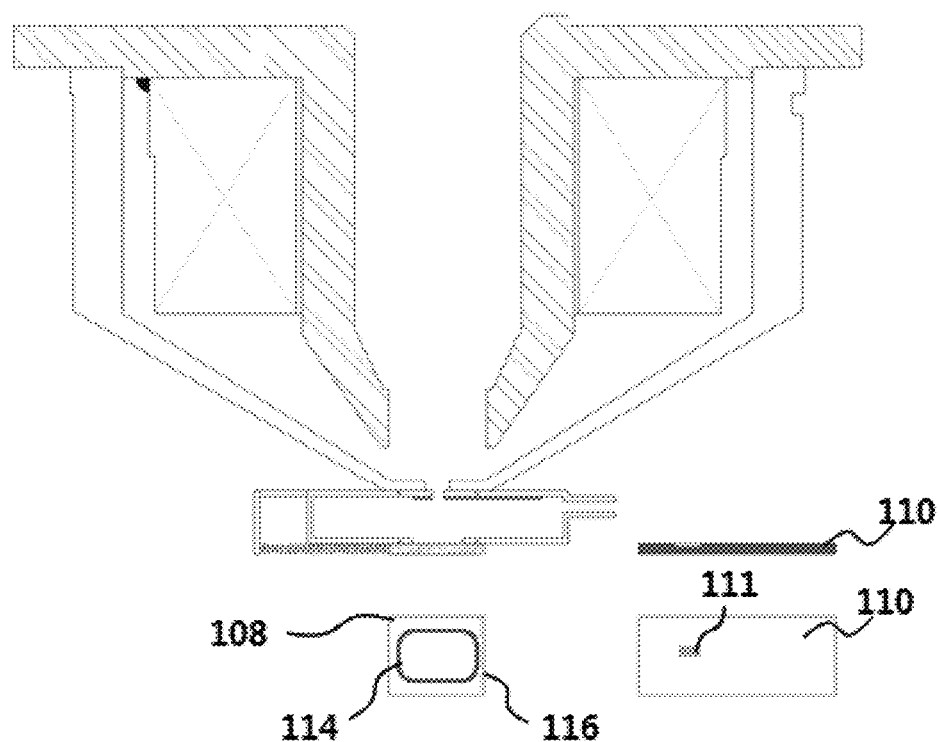
FIG. 2C is a conceptual view illustrating that the vacuum holding plate and the sample holder are separated from each other.

FIG. 2A is a conceptual view illustrating that a sample is placed at a sample observation position according to the embodiment of the present invention, FIG. 2B is a conceptual view illustrating that the sample holder is horizontally moved to remove the sample from the second space, and FIG. 2C is a conceptual view illustrating that the vacuum holding plate and the sample holder are separated from each other. When a sample is placed at the sample observation position, a researcher can observe the sample in order to analyze the sample. When the sample holder is horizontally moved to remove the sample from the second space, the vacuum holding plate 108 and the sample holder 110 may be in contact with the respective halves of the first ring-shaped sealing member 116 while being brought in contact with each other with the linear sealing member 114 interposed therebetween. When the vacuum holding plate 108 and the sample holder 110 are separated from each other, the sample holder 110 may be isolated from the track part.

Figure 3:
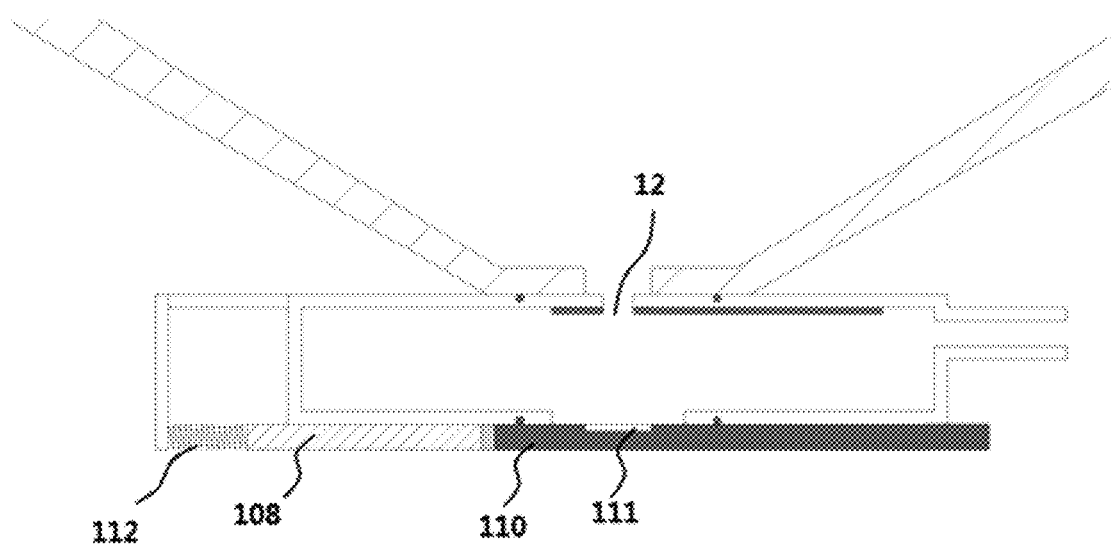
FIG. 3 is a conceptual view illustrating that the sample holder is mounted so that a beam is incident on a sample according to the embodiment of the present invention.

FIG. 3 is a conceptual view illustrating that the sample holder is mounted so that a beam is incident on a sample, according to the embodiment of the present invention. In an embodiment of the present invention, the elastic member 112 may include a spring. When the vacuum holding plate 108 is horizontally moved, the spring is compressed, and an electron beam incident from the aperture 122 collides with the sample placed in the sample groove 111 of the sample holder 110. At this position, the track part may have a fastening part for fixing the vacuum holding plate and the sample holder 110. In an embodiment of the present invention, the elastic member may include a metallic member or elastic rubber having a restoring force.

Figure 4:
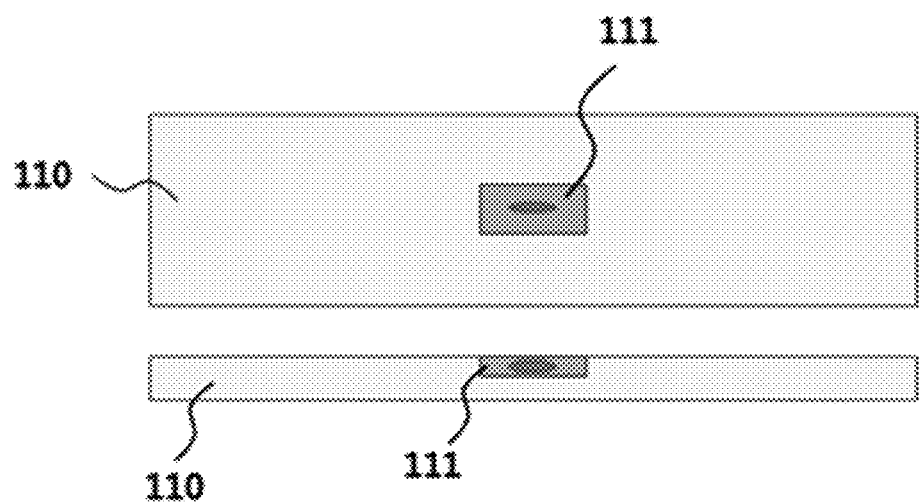
FIG. 4 is a plan and front cross-sectional view of the sample holder according to the embodiment of the present invention.

FIG. 4 is plan and front cross-sectional views of the sample holder 110 according to the embodiment of the present invention. In an embodiment of the present invention, the sample groove 111 serves to protect the sample when the sample holder 110 is horizontally moved while coming in contact with the first ring-shaped sealing member 116. Since the depth of the sample groove 111 is larger than the height of the sample, the sample does not come in contact with the ring-shaped sealing member when the sample holder 110 is horizontally moved. That is, when the sample is placed, the sample may be located in the sample groove. Thus, when the sample holder is moved, the sample can be protected.

Figure 5A:
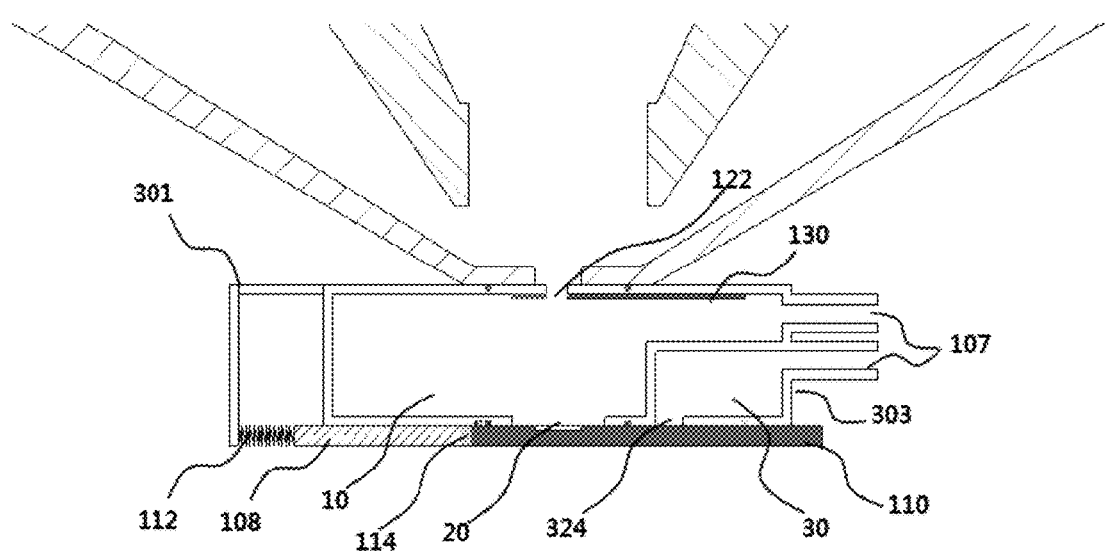
FIG. 5A is a cross-sectional view illustrating that a vacuum sample chamber including a second ring-shaped seaming member according to an embodiment of the present invention is brought in contact with a body tube.
Figure 5B:
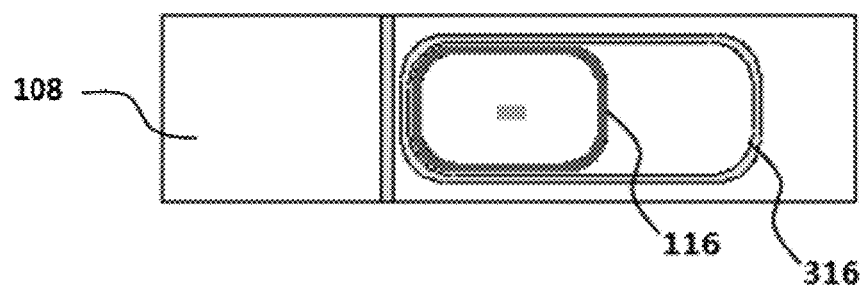
FIG. 5B is a plan view of a vacuum holding plate and a sample holder with a linear sealing member interposed therebetween.

FIG. 5 illustrates a sample chamber device for an electron microscope according to another embodiment of the present invention. The sample chamber device includes a first vacuum chamber 301, a third vacuum chamber 303, an external connection part for the first and third vacuum chambers 301 and 303, an electron detector 130, and a sample holder 110. The first vacuum chamber 301 has an aperture 122 formed at a top surface portion such that an electron beam emitted from a body tube is incident through the aperture 122, and includes a vacuum holding plate 108 for sealing a hole of a bottom surface portion from outside, the hole facing the aperture. The third vacuum chamber 303 is parallel to the bottom surface portion of the first vacuum chamber 301 while being in contact with the first vacuum chamber 301, and seals a bottom surface portion having a hole formed therein with the vacuum holding plate. The electron detector 130 is located in the first vacuum chamber. The sample holder 110 can be horizontally moved toward the vacuum holding plate while the first and third vacuum chambers are maintained in a vacuum state, and has a sample groove formed therein. The sample groove is horizontally moved and exposed to the first or third vacuum chamber, and the vacuum chambers and the sample holder are formed of a material capable of shielding radioactive rays including X-rays. Referring to FIG. 6B, a linear sealing member 114 may be interposed between the vacuum holding plate 108 and the sample holder 110 so as to maintain the vacuum of the first vacuum chamber.

In an embodiment of the present invention, the first vacuum chamber 301 includes the top surface portion, the bottom surface portion, a side portion, a first ring-shaped sealing member 116 and the vacuum holding plate 108. The top surface portion has the aperture 122 formed in the center thereof such that an electron beam passes through the aperture 122. The bottom surface portion faces the top surface portion, and has a hole formed at a position facing the aperture of the top surface portion such that the electron beam can pass through the hole. The side surface portion forms a first space 10 by airtightly connecting the corners of the top surface portion and the bottom surface portion, and has a vacuum exhaust part 107 formed therein. The first ring-shaped sealing member 116 is brought in airtight contact with the outer surface of the bottom surface portion at the first space, while surrounding the hole. The vacuum holding plate 108 is brought in contact with the ring-shaped sealing member to form the airtight second space with the first ring-shaped sealing member 116 and the bottom surface portion surrounded by the first ring-shaped sealing member 116, and can be horizontally moved.

The third vacuum chamber 303 includes a space portion, the bottom surface portion, the first ring-shaped sealing member 116, a second ring-shaped sealing member 316 and the vacuum holding plate 108. The space portion has a third space 30 formed therein, and includes the vacuum exhaust part 107. The bottom surface portion has the hole formed at a predetermined distance from the hole of the bottom surface portion of the first vacuum chamber. The first ring-shaped sealing member 116 surrounds the hole of the bottom surface of the first vacuum chamber. The second ring-shaped sealing member 316 surrounds the hole 324 of the bottom surface portion of the third vacuum chamber. The vacuum holding plate 108 is brought in contact with the first and second ring-shaped sealing members at the same time so as to form the second and third spaces 20 and 30, and can be horizontally moved.

The external connection part for the first and third vacuum chambers includes a track part and an elastic member 112. The track part fixes the sample holder such that the sample holder brought in contact with the vacuum holding plate 108 with the linear sealing member 114 interposed therebetween can be horizontally moved while coming in contact with the first and second ring-shaped sealing members 116 and 316, in order to push out the vacuum holding plate 108 while maintaining the airtightness of the second space 20, after the sample groove of the sample holder is placed in the third space to perform vacuum exhaust. The elastic member 112 applies a restoring force to the vacuum holding plate to face the formation positions of the second and third spaces, such that the vacuum holding plate is in airtight contact with the sample holder with the linear sealing member interposed therebetween. The electron detector 130 is located on the inner surface of the top surface portion at the first space in the first vacuum chamber. In an embodiment of the present invention, the first vacuum chamber and the third vacuum chamber may be connected to separate exhaust lines or one exhaust line, or simultaneously connected to an exhaust line of the body tube.

In an embodiment of the present invention, the sample holder is formed in a plate shape which can be brought in airtight contact with the vacuum holding plate. When the vacuum holding plate is pushed out to form the second space, the sample groove is placed in the second space. The sample groove secures a level difference to protect a sample, when the sample holder is horizontally moved while coming in contact with the first and second ring-shaped sealing members.

Figure 6A:
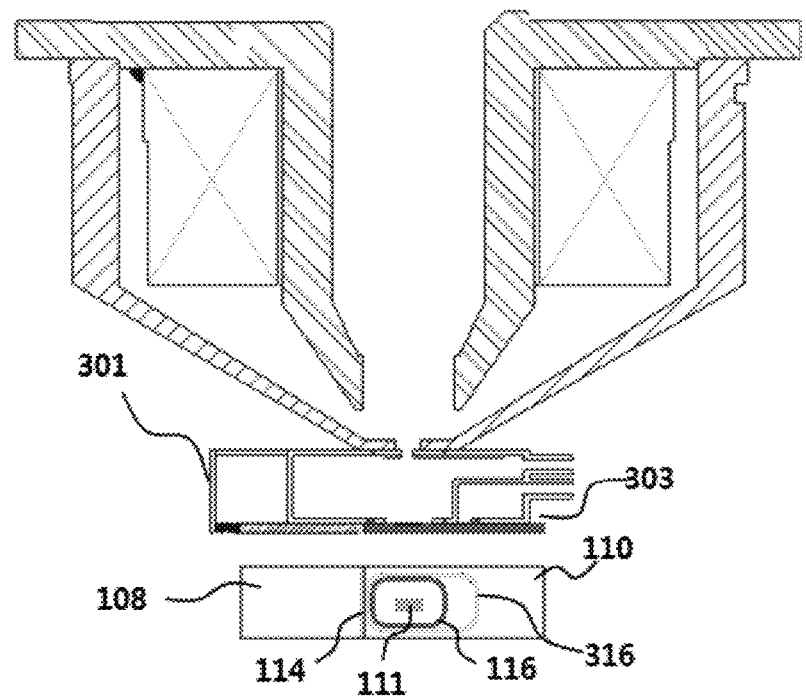
FIG. 6A is a conceptual view illustrating that the sample holder is placed at a sample observation position in the vacuum sample chamber including the second ring-shaped sealing member according to the embodiment of the present invention.
Figure 6B:
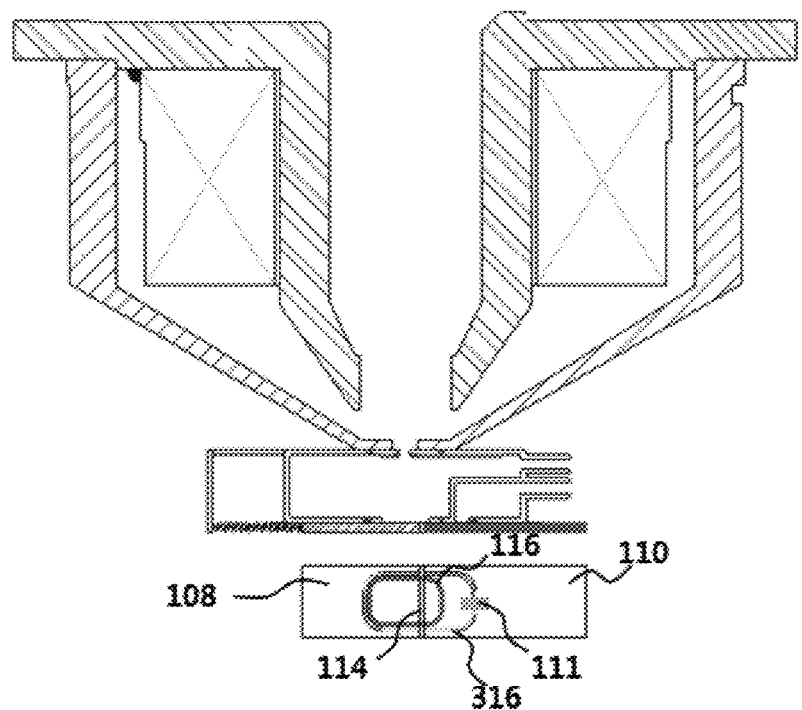
FIG. 6B is a conceptual view illustrating that the sample holder is horizontally moved to remove the sample from a second space.
Figure 6C:
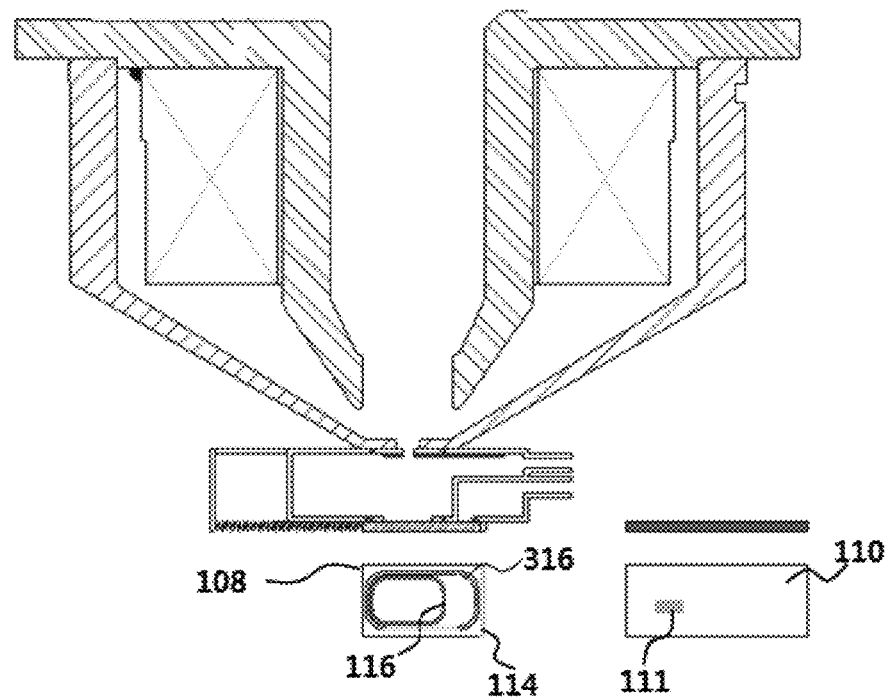
FIG. 6C is a conceptual view illustrating that the vacuum holding plate and the sample holder are separated from each other.

FIG. 6A is a conceptual view illustrating that the sample holder 110 is placed at the sample observation position in the electron microscope including the sample chamber device of FIG. 5, FIG. 6B is a conceptual view illustrating that the sample holder is horizontally moved to remove the sample groove 111 from the second space, and FIG. 6C is a conceptual view illustrating that the vacuum holding plate and the sample holder are separated from each other. When the sample is placed at the sample observation position as illustrated in FIG. 6A, an observation for sample analysis can be performed. In this state, when the sample is loaded, the sample holder 110 is pushed into the third vacuum chamber 303 in order to perform primary vacuum exhaust. Then, the sample holder 110 is pushed into the first vacuum chamber 301 in order to perform secondary vacuum exhaust. Therefore, the vacuum state of the sample chamber can be maintained more effectively. In an embodiment, the vacuum exhaust of the third vacuum chamber may be performed through a rotary, scroll or diaphragm pump, while the third vacuum chamber is maintained at a pressure of $10^{-3}$ Torr, and the vacuum exhaust of the first vacuum chamber may be performed through a turbo or ion pump, while the first vacuum chamber is maintained at a pressure of $10^{-4}$ Torr. When the sample holder is horizontally moved to remove the sample groove 111 from the second space as illustrated in FIG. 6B, the sample holder may be pushed from the first vacuum chamber and brought in contact with the second vacuum sample chamber. In this state, the sample holder 110 comes in contact with the first and second ring-shaped sealing members 116 and 316 while the vacuum holding plate 108 and the sample holder 110 are brought in contact with each other with the linear sealing member 114 interposed therebetween. When the vacuum holding plate 108 and the sample holder 110 are separated from each other as illustrated in FIG. 6C, the sample holder 110 is isolated from the track part. In this state, the holes of the bottom surface portions of the first and third vacuum chambers 301 and 303 are in airtight contact with the vacuum holding plate 108.

Figure 7:
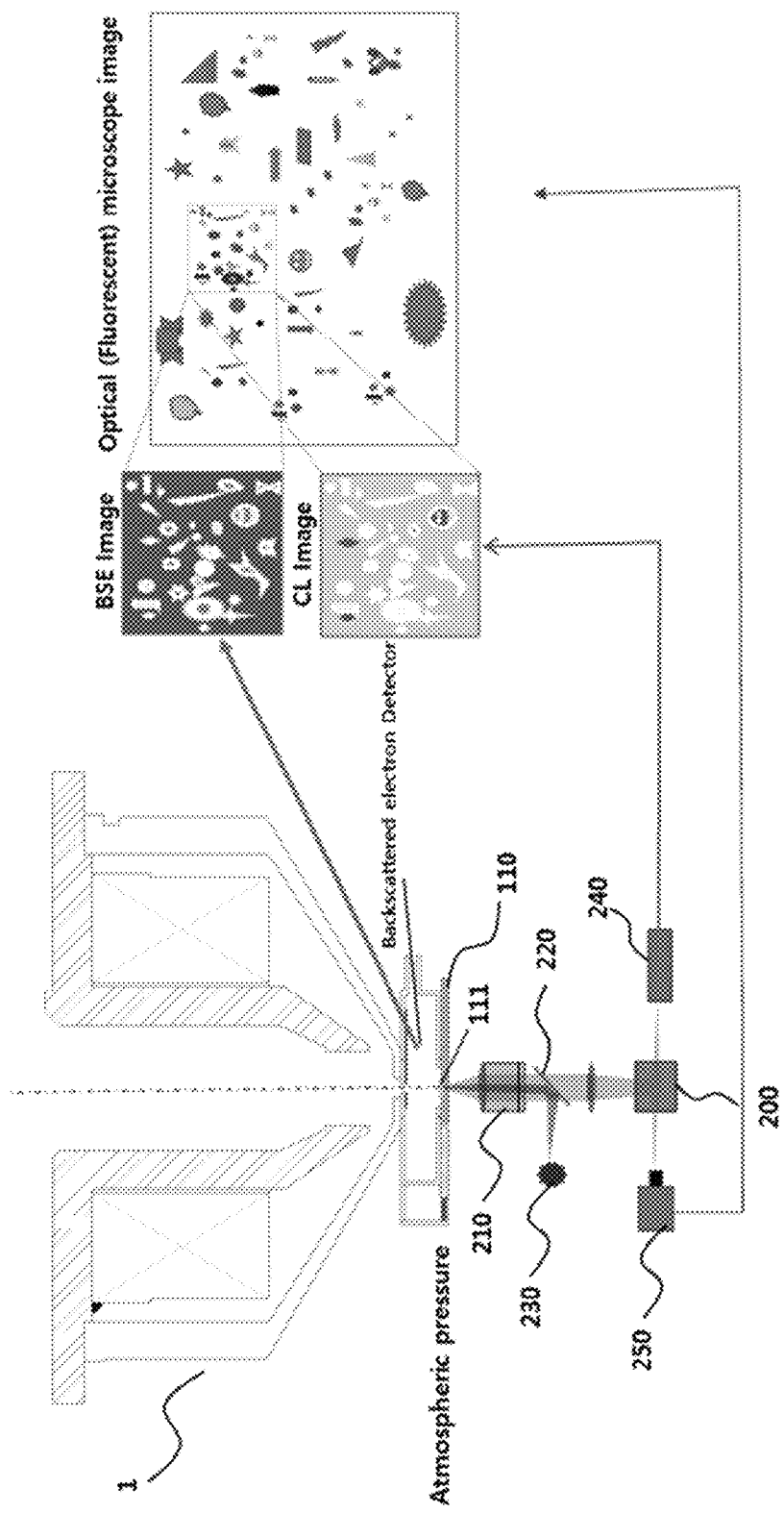
FIG. 7 is a conceptual view illustrating a photoelectron microscope including an optical microscope unit and an electron microscope unit that uses the vacuum sample chamber according to the embodiment of the present invention as a sample chamber.

FIG. 7 is a conceptual view illustrating a photoelectron microscope including an optical microscope unit 200 and an electron microscope 1 that uses the vacuum sample chamber according to the embodiment of the present invention as a sample chamber. The optical microscope unit 200 includes an optical object lens 210, an optical path branching device 220, a light source 230, a cathode luminescence detector 240 and an optical image detector 250. The optical object lens 210 is located outside the second space of the sample holder so as to face the sample groove. The optical path branching device 220 is located on an extension line of an optical path connected from a sample loading portion to the optical object lens, in order to branch the optical path. The light source 230 provides the optical path and incident light to the optical path branching device. The cathode luminescence detector 240 detects cathode luminescence at a position of the optical path past the optical path branching device. The optical image detector 250 detects an optical image at the position of the optical path past the optical path branching device. In an embodiment of the present invention, the sample holder employed in the photoelectron microscope passes transmits rays including visible ray, infrared ray and ultraviolet ray.

In an embodiment of the present invention, the cathode luminescence is emitted from an electron beam incident on a sample placed in the sample groove, and the optical image corresponds to an image which is generated when incident light provided from the light source goes back along the optical path through the optical path branching device 220, passes through the sample holder 110, and reflects from the sample placed in the sample groove 111. The optical path device may include a translucent mirror, and the cathode luminescence detector and the optical image detector acquire the cathode luminescence and the optical image by temporally or spatially dividing light through a beam splitter. In an embodiment of the present invention, the cathode luminescence detector and the optical image detector may be arranged in such a manner that a line connecting the cathode luminescence detector and the optical image detector is perpendicular to the optical path, and the mirror for changing the direction of the optical path by 90 degrees may be rotated, in order to perform the space division. The time division is performed in such a manner that light incident parts of the cathode luminescence detector and the optical image detector are alternately appear on the optical path.

While the present invention has been particularly shown and described with reference to preferred embodiments thereof, it will be understood by those skilled in the art that various changes in form and details may be made therein without departing from the spirit and scope of the invention as defined by the appended claims.

All technical terms used in this specification are used as meanings which are generally understood by those skilled in the art to which the present invention pertains, as long as they are not defined as different meanings. The contents of all publications described as cited documents in this specification are introduced into the present invention.

The invention claimed is:

1. A sample chamber device for an electron microscope, comprising:
   a vacuum chamber having an aperture formed in a top surface portion thereof such that an electron beam emitted from a body tube is incident through the aperture, and including a vacuum holding plate sealing a hole of a bottom surface portion from outside, the hole facing the aperture;
   an electron detector located in the vacuum chamber; and
   a sample holder being horizontally movable to the position of the vacuum holding plate while the vacuum chamber is maintained in a vacuum state, and having a sample groove formed therein,
   wherein the sample groove is configured to be horizontally moved and exposed to the vacuum chamber,
   wherein the vacuum chamber and the sample holder are formed of a material capable of shielding radioactive rays including X-rays,
   wherein the vacuum chamber comprises:
      the top surface portion having the aperture formed in the center thereof such that the electron beam passes through the aperture;
      the bottom surface portion facing the top surface portion, and having the hole formed at a position facing the aperture of the top surface portion such that the electron beam passes through the hole;
      a side surface portion airtightly connecting the corners of the top surface portion and the bottom surface portion so as to form a first space therein, and having a vacuum exhaust part formed therein;
      a ring-shaped sealing member being in airtight contact with an outer surface of the bottom surface portion at the first space, and surrounding the hole;
      the vacuum holding plate being in contact with the ring-shaped sealing member to form a sealed second space with the ring-shaped sealing member and the bottom surface portion surrounded by the ring-shaped sealing member, and movable in the horizontal direction;
      a track part configured to fix the sample holder such that the sample holder brought in contact with the vacuum holding plate with a linear sealing member interposed therebetween is horizontally moved while coming in contact with the ring-shaped sealing member, in order to push out the vacuum holding plate while maintaining airtightness of the second space; and
      an elastic member configured to apply a restoring force to the vacuum holding plate to face the formation position of the second space, such that the vacuum holding plate maintains airtightness with the sample holder, with the linear sealing member interposed therebetween,
   wherein the electron detector is positioned over the inner surface of the top surface portion at the first space.

2. The sample chamber device of claim 1, wherein the sample holder is formed in a plate shape which is brought in airtight contact with the vacuum holding plate, and
   wherein the sample groove is placed in the second space when the vacuum holding plate is pushed out to form the second space, and configured to secure a level difference to protect a sample when the sample holder is horizontally moved while coming in contact with the ring-shaped sealing member.

3. The sample chamber device of claim 1, wherein the electron detector comprises a secondary electron detector.

4. The sample chamber device of claim 1, wherein the track part has a fastening part for fixing the vacuum holding plate and the sample holder when the vacuum holding plate and the sample holder are placed at a predetermined position of the second space.

5. The sample chamber device of claim 1, wherein the sample holder is configured to transmit rays including visible rays, infrared rays and ultraviolet rays.

6. A photoelectron microscope comprising: an electron microscope having the sample chamber device of claim 5; and an optical microscope unit,
wherein the optical microscope unit comprises:
an optical object lens placed to face the sample groove;
an optical path branching device installed on an extension line of an optical path connected from the sample groove to the optical object lens, and configured to branch the optical path;
a light source configured to provide incident light to the optical path branching device;
a cathode luminescence detector configured to detect cathode luminescence at a position of the optical path past the optical path branching device; and
an optical image detector configured to detect an optical image at a position of the optical path past the optical path branching device,
wherein the cathode luminescence is configured to be emitted from an electron beam incident on a sample located in the sample groove, and
the optical image comprises an image which is generated when incident light provided from the light source goes back along the optical path through the optical path branching device, passes through the sample holder through which the rays transmit, and reflects from the sample placed in the sample groove.

7. The optical-electron microscope of claim 6, wherein the cathode luminescence detector and the optical image detector are configured to acquire the cathode luminescence and the optical image by temporally or spatially splitting light through a beam splitter.

8. An electron microscope comprising the sample chamber device of claim 1.

9. A sample chamber device for an electron microscope, comprising:
a first vacuum chamber having an aperture formed in a top surface portion thereof such that an electron beam emitted from a body tube is incident through the aperture, and including a vacuum holding plate sealing a hole of a bottom surface portion from outside, the hole facing the aperture;
a second vacuum chamber located in parallel to the bottom surface portion of the first vacuum chamber while being in contact with the first vacuum chamber, and sealing a bottom surface portion with the vacuum holding plate, the bottom surface portion having a hole formed therein;
an external connection portion for the first and second vacuum chambers;
an electron detector located in the first vacuum chamber; and
a sample holder being horizontally movable to the position of the vacuum holding plate while the first and second vacuum chambers are maintained in a vacuum state, and having a sample groove formed therein,
wherein the sample groove is configured to be horizontally moved and exposed to the first or second vacuum chamber,
wherein the first and second vacuum chambers and the sample holder are formed of a material capable of shielding radioactive rays including X-rays,
wherein the first vacuum chamber comprises:
the top surface portion having the aperture formed in the center thereof such that the electron beam passes through the aperture;
the bottom surface portion facing the top surface portion, and having the hole formed at a position facing the aperture of the top surface portion such that the beam passes through the hole;
a side surface portion airtightly connecting the corners of the top surface portion and the bottom surface portion so as to form a first space therein, and having a vacuum exhaust part formed therein;
a first ring-shaped sealing member being in airtight contact with an outer surface of the bottom surface portion at the first space, and surrounding the hole; and
the vacuum holding plate being in contact with the first ring-shaped sealing member to form a sealed second space with the first ring-shaped sealing member and the bottom surface portion surrounded by the first ring-shaped sealing member, and moveable in the horizontal direction,
wherein the second vacuum chamber comprises:
a space portion forming a third space therein, and having a vacuum exhaust part formed therein;
a bottom surface portion having a hole formed at a predetermined distance from the hole of the bottom surface of the first vacuum chamber;
a second ring-shaped sealing member surrounding the hole of the bottom surface of the second vacuum chamber and the first ring-shaped sealing member surrounding the hole of the bottom surface portion of the first vacuum chamber; and
a vacuum holding plate being in contact with first and second ring-shaped sealing members at the same time so as to form the second and third spaces, and moveable in the horizontal direction,
wherein the external connection portion for the first and second vacuum chambers comprises:
a track part fixing the sample holder such that the sample holder brought in contact with the vacuum holding plate with a linear sealing member interposed therebetween is horizontally moved while coming in contact with the first and second ring-shaped sealing members, in order to push out the vacuum holding plate while maintaining the airtightness of the second space, after the sample groove of the sample holder is placed in the third space to perform vacuum exhaust; and
an elastic member applying a restoring force to the vacuum holding plate to face the formation positions of the second and third spaces, such that the vacuum holding plate maintains airtightness with the sample holder with the linear sealing member interposed therebetween,
wherein the electron detector is located on the inner surface of the top surface portion at the first space in the first vacuum chamber.

10. The sample chamber device of claim 9, wherein the sample holder is configured to transmit rays including visible rays, infrared rays and ultraviolet rays.

11. An electron microscope comprising the sample chamber device of claim 9.

12. A photoelectron microscope comprising: an electron microscope having the sample chamber device of claim 10; and an optical microscope unit,
   wherein the optical microscope unit comprises:
      an optical object lens placed to face the sample groove;
      an optical path branching device installed on an extension line of an optical path connected from the sample groove to the optical object lens, and configured to branch the optical path;
      a light source configured to provide incident light to the optical path branching device;
      a cathode luminescence detector configured to detect cathode luminescence at a position of the optical path past the optical path branching device; and
      an optical image detector configured to detect an optical image at a position of the optical path past the optical path branching device,
      wherein the cathode luminescence is emitted from an electron beam incident on a sample located in the sample groove, and
      the optical image comprises an image which is generated when incident light provided from the light source goes back along the optical path through the optical path branching device, passes through the sample holder through which the rays transmit, and reflects from the sample placed in the sample groove.

13. The optical-electron microscope of claim 12, wherein the cathode luminescence detector and the optical image detector are configured to acquire the cathode luminescence and the optical image by temporally or spatially splitting light through a beam splitter.

14. A sample chamber device for an electron microscope, comprising:
   a first vacuum chamber having an aperture formed in a top surface portion thereof such that an electron beam emitted from a body tube is incident through the aperture, and including a vacuum holding plate sealing a hole of a bottom surface portion from outside, the hole facing the aperture;
   a second vacuum chamber located in parallel to the bottom surface portion of the first vacuum chamber while being in contact with the first vacuum chamber, and sealing a bottom surface portion with the vacuum holding plate, the bottom surface portion having a hole formed therein;
   an external connection portion for the first and second vacuum chambers;
   an electron detector located in the first vacuum chamber; and
   a sample holder being horizontally movable to the position of the vacuum holding plate while the first and second vacuum chambers are maintained in a vacuum state, and having a sample groove formed therein,
   wherein the sample groove is configured to be horizontally moved and exposed to the first or second vacuum chamber,
   wherein the first and second vacuum chamber and the sample holder are formed of a material capable of shielding radioactive rays including X-rays,
   wherein the sample holder is formed in a plate shape which is brought in airtight contact with the vacuum holding plate, and
   wherein the sample groove is placed in the second space when the vacuum holding plate is pushed out to form the second space, and secures a level difference to protect a sample when the sample holder is horizontally moved while coming in contact with first and second ring-shaped sealing members.

* * * * *